United States Patent
Lee

(10) Patent No.: US 11,697,620 B2
(45) Date of Patent: Jul. 11, 2023

(54) METHOD FOR PREPARING SILICON-CARBIDE-SILICON-NITRIDE COMPOSITE MATERIAL, AND SILICON-CARBIDE- SILICON-NITRIDE COMPOSITE MATERIAL ACCORDING TO SAME

(71) Applicant: TOKAI CARBON KOREA CO., LTD, Gyeonggi-do (KR)

(72) Inventor: Sang Chul Lee, Gyeonggi-do (KR)

(73) Assignee: TOKAI CARBON KOREA CO., LTD, Gyeonggi-do (KR)

( * ) Notice: Subject to any disclaimer, the term of this patent is extended or adjusted under 35 U.S.C. 154(b) by 0 days.

(21) Appl. No.: 17/600,400

(22) PCT Filed: Mar. 11, 2020

(86) PCT No.: PCT/KR2020/003339
§ 371 (c)(1),
(2) Date: Sep. 30, 2021

(87) PCT Pub. No.: WO2020/213835
PCT Pub. Date: Oct. 22, 2020

(65) Prior Publication Data
US 2022/0144710 A1     May 12, 2022

(30) Foreign Application Priority Data
Apr. 17, 2019  (KR) .................. 10-2019-0044654

(51) Int. Cl.
*C04B 35/622* (2006.01)
*C04B 35/565* (2006.01)

(52) U.S. Cl.
CPC .......... *C04B 35/622* (2013.01); *C04B 35/565* (2013.01); *C04B 2235/3826* (2013.01);
(Continued)

(58) Field of Classification Search
CPC .......... C04B 35/565; C04B 2235/3826; C04B 2235/3873; C04B 2235/46;
(Continued)

(56) References Cited

U.S. PATENT DOCUMENTS

| | | | |
|---|---|---|---|
| 7,446,066 B1* | 11/2008 | Sun | C04B 35/14 428/404 |
| 2004/0043888 A1* | 3/2004 | Ando | C04B 35/634 501/84 |

FOREIGN PATENT DOCUMENTS

| | | |
|---|---|---|
| JP | H02129365 A | 5/1990 |
| JP | H0417661 A | 1/1992 |
| KR | 20030047799 A | 6/2003 |
| KR | 20140038426 A | 3/2014 |
| TW | 201011119 A | 3/2010 |

OTHER PUBLICATIONS

Gang, Jong-Bong, Beom-Rae Jo, and Su-Yeong Lee. "Fabrication and Mechanical Properties of $ SiC/Si\_3N\_4 $ Nano Composite Materials." Korean Journal of Materials Research 6.4 (1996): 421-427. (Year: 1996).*

(Continued)

*Primary Examiner* — Karl E Group
*Assistant Examiner* — Cameron K Miller
(74) *Attorney, Agent, or Firm* — KDW Firm PLLC

(57) ABSTRACT

The present invention relates to a method for preparing a $SiC$—$Si_3N_4$ composite material and a $SiC$—$Si_3N_4$ composite material prepared according to same and comprises the steps of: preparing a mold; and forming a $SiC$—$Si_3N_4$ composite material by introducing, to the mold, a source gas comprising Si, N and C, at 1100 to 1600° C. More particularly, the present invention provides the $SiC$—$Si_3N_4$ composite material of high purity that is applicable to a semiconductor process, and increases the thermal shock strength (Continued)

of a SiC material by causing $Si_3N_4$, which is a material with a high thermal shock strength, to grow together via a CVD method.

2 Claims, 4 Drawing Sheets

(52) U.S. Cl.
CPC .. *C04B 2235/3873* (2013.01); *C04B 2235/46* (2013.01); *C04B 2235/602* (2013.01); *C04B 2235/614* (2013.01); *C04B 2235/78* (2013.01); *C04B 2235/9607* (2013.01)

(58) Field of Classification Search
CPC ........ C04B 2235/602; C04B 2235/614; C04B 2235/78; C04B 2235/9607
See application file for complete search history.

(56) References Cited

OTHER PUBLICATIONS

Wikipedia article titles "Silicon Nitride" (Year: 2022).*
Wikipedia article titles "Silicon Carbide" (Year: 2022).*
Kim et al., "Systhesis and Crystallization of Fine Sic-SiN Composite Powders by the Vapor Phase Reaction" Journal of the Korean Ceramic Society 37(11), Nov. 2000, 1091-1096 (6 pages).
International Search Report for the International Patent Application No. PCT/KR2020/003339, dated Jun. 12, 2020, 2 pages.
Kim et al., "Synthesis and Crystallization of Fine Sic-Si3N4 Composite Powders by the Vapor Phase Reaction" Journal of Korean Ceramic Society, vol. 37, No. 11, pp. 1091-1096 (2000).
Kang et al., "Fabrication and Mechanical Properties of SiC/Si3N4 Nano Composite Materials" Korean Journal of Materials Research, vol. 6, No. 4 (1996).

* cited by examiner

METHOD FOR PREPARING SILICON-CARBIDE-SILICON-NITRIDE COMPOSITE MATERIAL, AND SILICON-CARBIDE- SILICON-NITRIDE COMPOSITE MATERIAL ACCORDING TO SAME

CROSS-REFERENCE TO RELATED APPLICATIONS

This application is a national phase entry of, claims the benefit of and priority to previously filed International Patent Application No. PCT/KR2020/003339, entitled "METHOD FOR PREPARING SILICON-CARBIDE-SILICON-NITRIDE COMPOSITE MATERIAL, AND SILICON-CARBIDE-SILICON-NITRIDE COMPOSITE MATERIAL ACCORDING TO SAME", filed Mar. 11, 2021, which claims priority to Korean Patent Application No. 10-2019-0044654 filed Apr. 17, 2019, which are hereby incorporated by reference in their entireties.

TECHNICAL FIELD

The present invention relates to a method for manufacturing a silicon carbide-silicon nitride (SiC—$Si_3N_4$) composite material and a silicon carbide-silicon nitride (SiC—$Si_3N_4$) composite material according thereto.

BACKGROUND ART

As for SiC (silicon carbide), a high-temperature type ($\alpha$-type) having a hexagonal crystal structure and a low-temperature type ($\beta$-type) having a cubic crystal structure have been known. There are characteristics in that, compared to Si, SiC not only has high heat resistance, but also has a wide band gap and has a large dielectric breakdown field strength. For that reason, a semiconductor made of a SiC single crystal has been expected as a candidate material for a next-generation power device replacing the Si semiconductor. In particular, $\alpha$-type SiC has been attracting attention as a semiconductor material for ultra-low power loss power devices because of its wider band gap than silicon.

Recently, interest in component materials for semiconductor manufacturing that have a direct impact on wafers has been increasing, and if a plasma gas control device is made using a CVD-SiC material which is excellent in high temperature-deformation resistance, high cleanliness, and chemical corrosion resistance compared to an existing sintered-SiC material, it is predicted that the lifespan of the plasma gas control device will be increased 2 to 3 times compared to the existing material.

The CVD-SiC material is high-purity SiC in which graphite is removed after SiC is deposited on graphite using CVD (chemical vapor deposition). The thus-made CVD-SiC is subjected to grinding processing for surface flatness and then grinding processing according to the shape of the plasma gas control device.

A wafer which has conventionally widely been used as such a CVD-SiC material is a dummy wafer, which is used to increase safety in the early stage of the production process, and size and thickness act as important factors. However, the dummy wafer has a thermal shock strength of about 450° C., and cracks are randomly occurred during rapid temperature rise and cooling for shortening the process time so that breakage of the Si wafer and breakage of diffusion equipment appear.

Therefore, there is a need for a material having high purity and high thermal shock strength, and the demand for a composite material in which silicon nitrides such as silicon nitride as well as simple silicon carbide are mixed has been increasing.

In particular, a method for improving mechanical properties by improving high densification, securing compactness, etc. of a composite material of silicon nitride and silicon carbide is being studied.

DISCLOSURE OF INVENTION

Technical Goals

The present invention is to solve the above-mentioned problems, and an object of the present invention is to provide a method for manufacturing a SiC—$Si_3N_4$ composite material, the method including the steps of preparing a mold, and forming the SiC—$Si_3N_4$ composite material by introducing a source gas containing Si, N, and C on the mold at 1100 to 1600° C.

However, the problems to be solved by the present invention are not limited to those mentioned above, and other problems not mentioned will be clearly understood by one of ordinary skill in the art from the following description.

Technical Solutions

A method for manufacturing a SiC—$Si_3N_4$ composite material according to an embodiment of the present invention includes the steps of preparing a mold, and forming the SiC—$Si_3N_4$ composite material by introducing a source gas containing Si, N, and C on the mold at 1100 to 1600° C.

According to an embodiment of the present invention, when a nitrogen (N) component and a carbon (C) component of nitrogen (N) and carbon (C) source gases among the source gases introduced are 1:1, the N source/C source ratio may be 0.4 to 2.

According to an embodiment of the present invention, the $Si_3N_4$ in the SiC—$Si_3N_4$ composite material may be 10 to 70% by volume.

According to an embodiment of the present invention, the SiC—$Si_3N_4$ composite material may have a thermal shock strength of 500 to 860° C.

According to an embodiment of the present invention, the SiC—$Si_3N_4$ composite material may have a thermal shock strength of 600 to 860° C., and the $Si_3N_4$ in the SiC—$Si_3N_4$ composite material may be 40 to 70% by volume.

According to an embodiment of the present invention, the step of forming the SiC—$Si_3N_4$ composite material may be performed by a CVD method.

A SiC—$Si_3N_4$ composite material according to another embodiment of the present invention includes SiC and $Si_3N_4$ and has a thermal shock strength of 600 to 860° C.

According to an embodiment of the present invention, the $Si_3N_4$ in the SiC—$Si_3N_4$ composite material may be 10 to 70% by volume.

According to an embodiment of the present invention, the SiC—$Si_3N_4$ composite material may be a mixture of amorphous SiC crystal grains and $Si_3N_4$ crystal grains having a needle-shaped structure.

According to an embodiment of the present invention, when the $Si_3N_4$ in the SiC—$Si_3N_4$ composite material has a volume ratio of 68 to 70% by volume, the $Si_3N_4$/SiC main peak may have a diffraction intensity ratio of 0.2 to 1.5.

According to an embodiment of the present invention, the SiC—Si$_3$N$_4$ composite material may be manufactured according to the manufacturing method according to the aforementioned embodiment.

Effects

The present invention may provide a method for manufacturing a SiC—Si$_3$N$_4$ composite material, the method including the steps of preparing a mold, and forming the SiC—Si$_3$N$_4$ composite material by introducing a source gas containing Si, N, and C on the mold at 1100 to 1600° C.

More specifically, it is possible to provide a high-purity SiC—Si$_3$N$_4$ composite material which increases the thermal shock strength of the SiC material and is applicable even to a semiconductor process by allowing a material with high thermal shock strength (Si$_3$N$_4$ with Δ° C. to grow together by the CVD method.

BEST MODE FOR CARRYING OUT THE INVENTION

Figure 1:
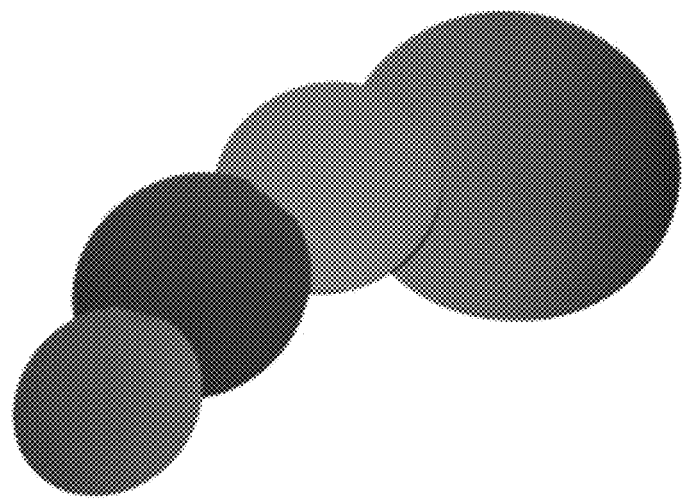
FIG. 1 is a cross-sectional view of a conventional SiC wafer (dummy wafer).

Hereinafter, embodiments of the present invention will be described in detail with reference to the accompanying drawings. However, since various changes may be made to the embodiments, the scope of rights of the patent application is not restricted or limited by such embodiments. All modifications, equivalents and substitutes for the embodiments should be understood to be included in the scope of the rights.

Terms used in the embodiments are used for the purpose of description only, and should not be construed as an intention of limiting the embodiments. An expression of the singular number includes an expression of the plural number unless clearly defined otherwise in the context.

Throughout the specification, when a member is said to be located "on" another member, this includes not only a case in which a member is in contact with another member but also a case in which another member is present between the two members. More specifically, when an element or layer is referred to as being "on," "connected to," or "coupled to" the other element or layer, this will be understood as the element or layer may be directly on the other element or layer, the element or layer may be connected or coupled to the other element or layer, or intervening elements and layer may be present.

Throughout the specification, when a part "includes" a certain element, it does not exclude other elements, but means that other elements may be further included, and it should be understood that a term such as "comprises" or "having" is used to specify existence of a feature, a number, a step, an operation, an element, a part, or a combination thereof described in the specification, but it does not preclude the possibility of the existence or addition of one or more other features, numbers, steps, operations, elements, parts, or combinations thereof.

Unless otherwise defined, all terms, including technical or scientific terms, used herein have the same meaning as those commonly understood by one of ordinary skill in the art to which the embodiments pertain. Terms, such as those defined in commonly used dictionaries, should be interpreted as having meanings that are consistent with those in the context of the related art, but are not interpreted as having ideal or excessively formal meanings unless clearly defined in the present application.

Further, in the description with reference to the accompanying drawings, the same elements are assigned the same reference numerals regardless of the reference numerals, and the overlapping description thereof will be omitted. In the description of the embodiments, if it is determined that a detailed description of a related known technology may unnecessarily obscure the gist of the embodiments, the detailed description will be omitted.

Hereinafter, a method for manufacturing a SiC—Si$_3$N$_4$ composite material according to the present invention and the SiC—Si$_3$N$_4$ composite material manufactured according to the method will be described in detail with reference to embodiments and drawings. However, the present invention is not limited to such embodiments and drawings.

Hereinafter, the present invention will be described in more detail by Exemplary Embodiment and Comparative Embodiment.

However, the following Exemplary Embodiment is only for illustrating the present invention, and the content of the present invention is not limited to the following Exemplary Embodiment.

A method for manufacturing a SiC—Si$_3$N$_4$ composite material according to an embodiment of the present invention includes the steps of preparing a mold, and forming the SiC—Si$_3$N$_4$ composite material by introducing a source gas containing Si, N and C on the mold at 1100 to 1600° C.

According to an aspect, the SiC—Si$_3$N$_4$ composite material may include a Si$_3$N$_4$ material having a relatively high thermal shock strength compared to SiC.

According to an aspect, the SiC—Si$_3$N$_4$ composite material may be manufactured by a CVD method and applied as a product group which requires a thermal shock strength of 500° C. or higher as in a diffusion process during a semiconductor process.

According to an aspect, Si$_3$N$_4$ of the SiC—Si$_3$N$_4$ composite material may be used in a harsh process to which thermal shock of 500° C. or higher is repeatedly applied, and may have a thermal shock strength (ΔT) of 1000° C. or higher.

According to an aspect, in order to manufacture the SiC—Si$_3$N$_4$ composite material, it may be preferably manufactured by the CVD method.

According to an aspect, the SiC—Si$_3$N$_4$ composite material may not only have high strength and specific elasticity, and excellent high-temperature strength and resistance to thermal shock, may but also improve oxidation problems in a high-temperature oxidizing atmosphere.

According to an aspect, the SiC is not particularly limited as long as it has a high melting point, good toughness, and excellent oxidation resistance and wear resistance.

According to an aspect, the $Si_3N_4$, as a material in which oxygen is not present, and which has a very low oxygen diffusion coefficient, acts as a barrier to oxygen so that it may have excellent fracture strength, fracture toughness, and thermal shock resistance at high temperatures, and may be superior to SiC, especially in terms of wear resistance.

According to an aspect, in the step of preparing the mold, the mold may include SiC, and the mold including SiC may be manufactured using a sintering method or CVD. A mold made of a SiC material may be prepared by using without limitation a SiC sintering method or SiC CVD (chemical vapor deposition method) which has been widely known in the art.

According to an aspect, in the step of forming a SiC—$Si_3N_4$ composite material by introducing a source gas containing Si, N and C on the mold at 1100 to 1600° C., physical properties of the SiC—$Si_3N_4$ composite material may vary depending on the supply rate or type of the source gas.

According to an aspect, although the source gas containing Si, N and C is not particularly limited as long as it is a gas capable of supplying silicon, nitrogen, and carbon, it may include, for example, one or more selected from the group consisting of TCS, MTS, $SH_4$, $SiCl_4$, $N_2$, $HN_3$, $CH_4$, and $C_3H_8$.

According to an aspect, the source gas containing Si, N and C includes all of silicon, nitrogen, and carbon so that it may not only allow deposition by CVD to be performed by supplying one type of gas only, may but also allow deposition by CVD to be performed step by step by complex supply of each source gas containing silicon, nitrogen, or carbon respectively.

According to an aspect, although the step of forming the SiC—$Si_3N_4$ composite material may be performed at various temperatures, when thermal CVD is used, it may be performed preferably at 1100 to 1600° C., it may be difficult to perform deposition at a temperature lower than 1100° C., and deposition may be difficult or the mold may be damaged at a temperature higher than 1600° C.

According to an aspect, the step of forming the SiC—$Si_3N_4$ composite material by introducing the source gas containing Si, N and C may include a step of injecting the source gas containing Si, N and C into a reaction chamber of a CVD deposition apparatus, and gases injected into the reaction chamber may further include an inert gas in addition to the source gas containing Si, N, and C.

According to an aspect, a deposition pressure within the reaction chamber may be 400 to 700 torr.

According to an embodiment of the present invention, when the nitrogen (N) component and the carbon (C) component of the nitrogen (N) and carbon (C) source gases among the source gases introduced are 1:1, the N source/C source ratio may be 0.4 to 2.

According to an aspect, when a source gas having an N source/C source ratio within the numerical range is introduced, it may be possible to manufacture a superior SiC—$Si_3N_4$ composite material in which the ratio of SiC and $Si_3N_4$ is properly harmonized so that cracks due to high thermal shock strength do not occur even during rapid temperature rise and cooling.

Figure 4:
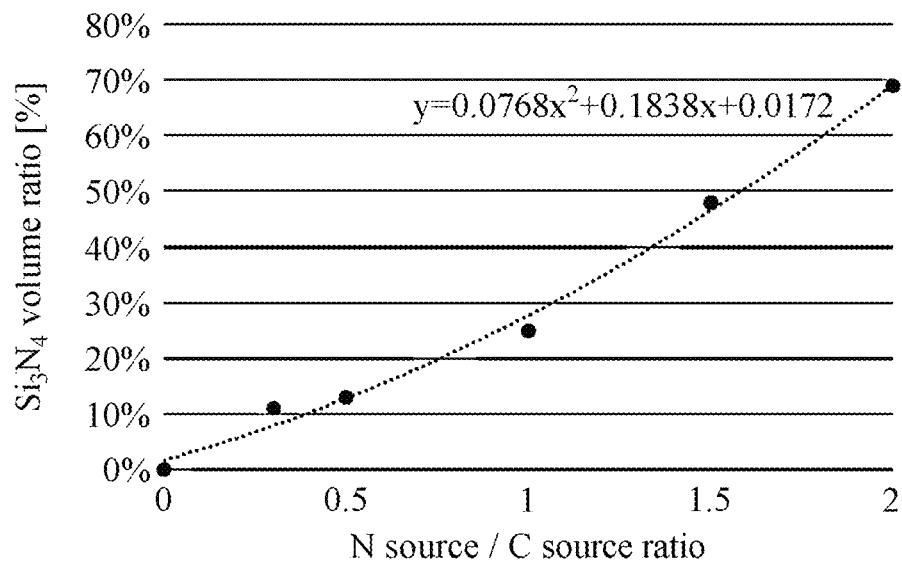
FIG. 4 is a graph showing changes in the Si$_3$N$_4$ content ratio according to the N/C source ratio of the SiC—Si$_3$N$_4$ composite material manufactured according to an embodiment of the present invention.

FIG. 4 is a graph showing changes in the $Si_3N_4$ content ratio according to the N source/C source ratio of the SiC—$Si_3N_4$ composite material manufactured according to an embodiment of the present invention. According to FIG. 4, when the N source/C source ratio is 0.4 to 2, the $Si_3N_4$ content ratio becomes about 10 to 70% so that a certain content ratio may be included in the SiC—$Si_3N_4$ composite material, and excellent thermal shock strength may be secured.

Figure 5:
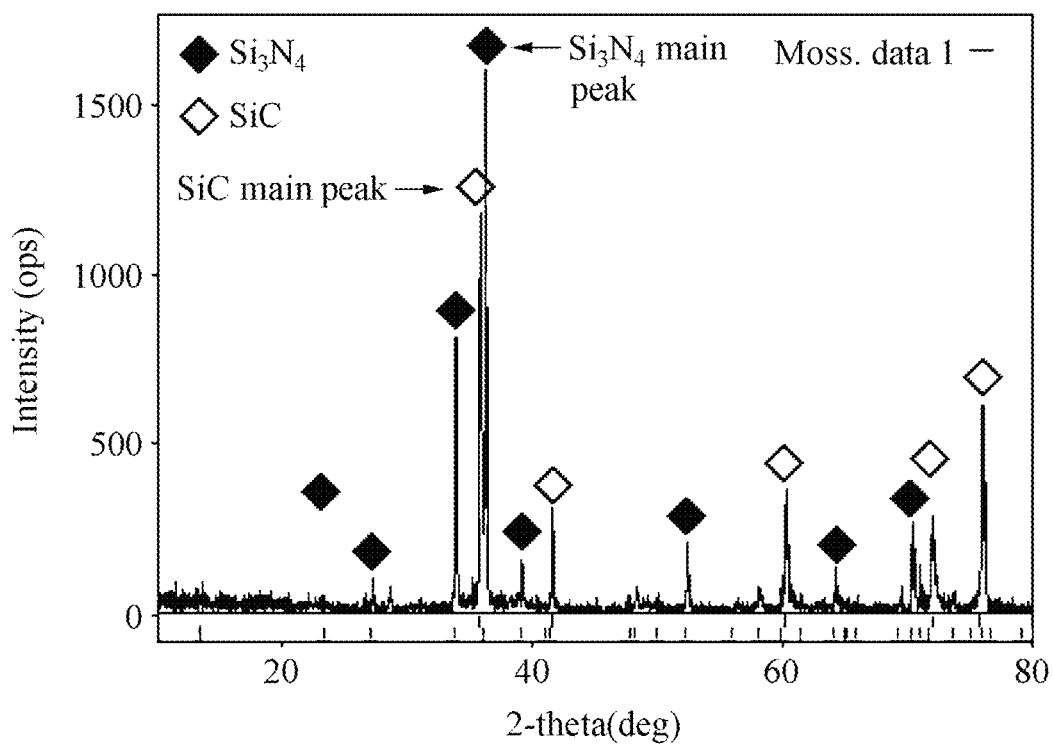
FIG. 5 is a graph showing intensity values according to 2-theta when the Si$_3$N$_4$ content ratio according to the N/C source ratio of the SiC—Si$_3$N$_4$ composite material manufactured according to an embodiment of the present invention is 69%.

FIG. 5, as a graph showing intensity values according to 2-theta when the $Si_3N_4$ content ratio according to the N source/C source ratio=2 of the SiC—$Si_3N_4$ composite material manufactured according to an embodiment of the present invention is 69%, refers to β-SiC and α-$Si_3N_4$ crystal structures, and the diffraction intensity ratio of the main peak of each crystal phase may change depending on the $Si_3N_4$ content ratio. According to FIG. 5, when the $Si_3N_4$ content ratio is 69%, the $Si_3N_4$ main peak diffraction intensity/SiC main peak diffraction intensity ratio may be 1.5.

According to an embodiment of the present invention, the $Si_3N_4$ in the SiC—$Si_3N_4$ composite material may be 10 to 70% by volume.

According to an aspect, in the case of a composite material in which $Si_3N_4$ in the SiC—$Si_3N_4$ composite material has a volume content of less than 10% by volume, the content of $Si_3N_4$ is excessively low to lower the thermal shock strength, thereby causing cracks to occur due to rapid temperature changes so that breakage of diffusion equipment may occur.

When the volume content of $Si_3N_4$ exceeds 70% by volume, the content of $Si_3N_4$ is excessively high and the content of SiC is lowered so that growth by CVD deposition may be difficult.

According to an embodiment of the present invention, the SiC—$Si_3N_4$ composite material may have a thermal shock strength of 500 to 860° C.

According to an aspect, the measurement of the thermal shock strength may be made by the KS L 1611 measuring method.

According to an aspect, the thermal shock strength may mean a physical property which withstands without generating cracks even by a temperature difference due to rapid temperature rise and cooling, and may be expressed as ΔT.

According to an aspect, the thermal shock strength of 500 to 860° C. means that breakage of the Si wafer or breakage of the diffusion equipment does not occur without generating cracks in the SiC—$Si_3N_4$ composite material even at a temperature difference of 500 to 860° C.

According to an aspect, frequent cracks may occur due to repeated thermal shock in the semiconductor wafer process when the thermal shock strength is less than 500° C., and realistic manufacturing may be difficult when the thermal shock strength exceeds 860° C.

According to an embodiment of the present invention, the SiC—$Si_3N_4$ composite material may have a thermal shock strength of 600 to 860° C., and the $Si_3N_4$ in the SiC—$Si_3N_4$ composite material may be 40 to 70% by volume.

According to an aspect, the SiC—$Si_3N_4$ composite material may preferably have a thermal shock strength of 600 to 860° C.

According to an aspect, $Si_3N_4$ mixed to increase the thermal shock strength in the SiC—$Si_3N_4$ composite material may have a volume content of preferably 40 to 70% by volume.

Figure 6:
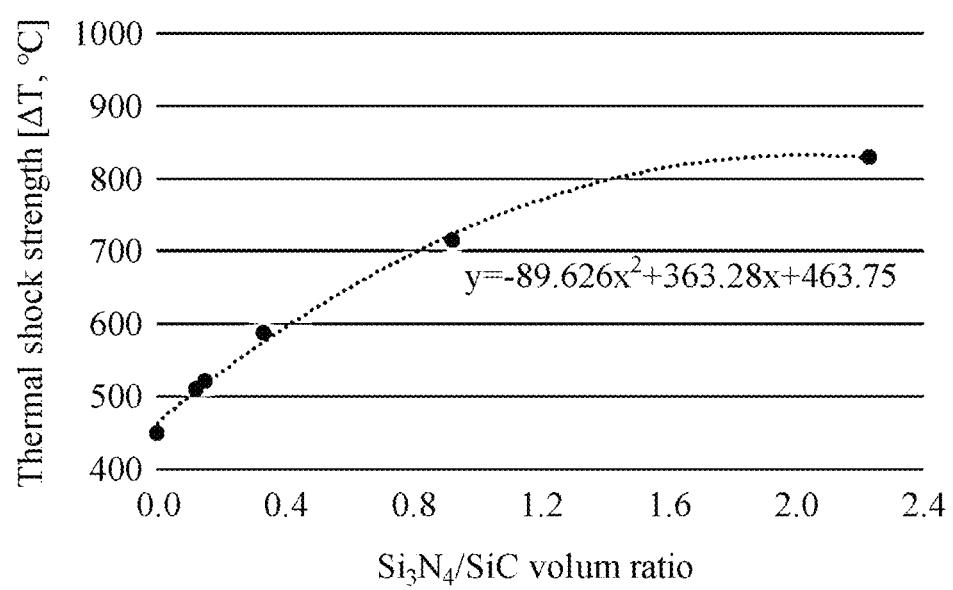
FIG. 6 is a graph showing changes in the thermal shock strength according to the Si$_3$N$_4$ content of the SiC—Si$_3$N$_4$ composite material manufactured according to an embodiment of the present invention.

FIG. 6 is a graph showing changes in the thermal shock strength according to the $Si_3N_4$ content of the SiC—$Si_3N_4$ composite material manufactured according to an embodiment of the present invention, and it can be confirmed that the thermal shock strength is 600° C. or higher at a time point when the $Si_3N_4$ content exceeds 40%, and the thermal shock strength is rapidly increased to lower than 700° C. until the $Si_3N_4$ content becomes less than 80%.

According to an embodiment of the present invention, the step of forming the $SiC$—$Si_3N_4$ composite material may be performed by a CVD method.

According to an aspect, the CVD method is not particularly limited as long as it is a commonly used CVD method (chemical vapor deposition method), and may include, for example, inductively coupled plasma-chemical vapor deposition (ICP-CVD), low pressure chemical vapor deposition (LPCVD), atmospheric pressure chemical vapor deposition (APCVD), and plasma-enhanced chemical vapor deposition (PECVD).

According to an embodiment of the present invention, the $SiC$—$Si_3N_4$ composite material may have impermeability.

According to an aspect, the $SiC$—$Si_3N_4$ composite material may exhibit impermeability and have high purity and high thermal shock strength by improving permeability of an existing SiC.

A $SiC$—$Si_3N_4$ composite material according to another embodiment of the present invention may include SiC and $Si_3N_4$, and may have a thermal shock strength of 600 to 860° C.

According to an aspect, the $SiC$—$Si_3N_4$ composite material is a mixture of SiC and $Si_3N_4$, and cracks may not occur in the $SiC$—$Si_3N_4$ composite material even at a sharp temperature difference of 600 to 860° C.

According to an embodiment of the present invention, the $Si_3N_4$ in the $SiC$—$Si_3N_4$ composite material may be 10 to 70% by volume.

According to an aspect, the volume ratio of the $Si_3N_4$ may be obtained by measuring data at a scan speed of 10 and a scan step of 0.05 using XRD equipment (Regaku, DMAX2000) when the measurement voltage and current values are 40 kV and 40 mA respectively so that both $\beta$ and $\alpha$-$Si_3N_4$ peaks identical to JCPDS data appear on the measured data, and analyzing the measured data as a ratio to the sum of the peak areas of respective SiC and $Si_3N_4$ crystal phases.

According to an aspect, the $Si_3N_4$ in the $SiC$—$Si_3N_4$ composite material may be preferably 40 to 70% by volume.

According to an embodiment of the present invention, the $SiC$—$Si_3N_4$ composite material may be a mixture of amorphous SiC crystal grains and $Si_3N_4$ crystal grains having a needle-shaped structure.

According to an aspect, the SiC crystal grains may be amorphous thin flakes, the $Si_3N_4$ crystal grains may have a needle-shaped structure, and the SiC crystal grains and the $Si_3N_4$ crystal grains may be mixed with each other.

Figure 2:
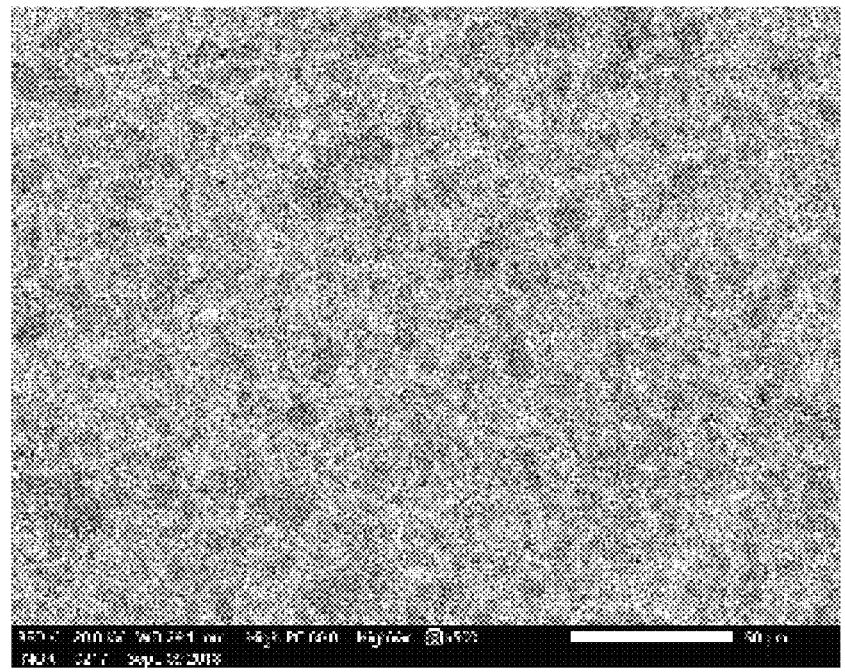
FIG. 2 is a surface microstructure image of a conventional SiC wafer (dummy wafer).
Figure 3:
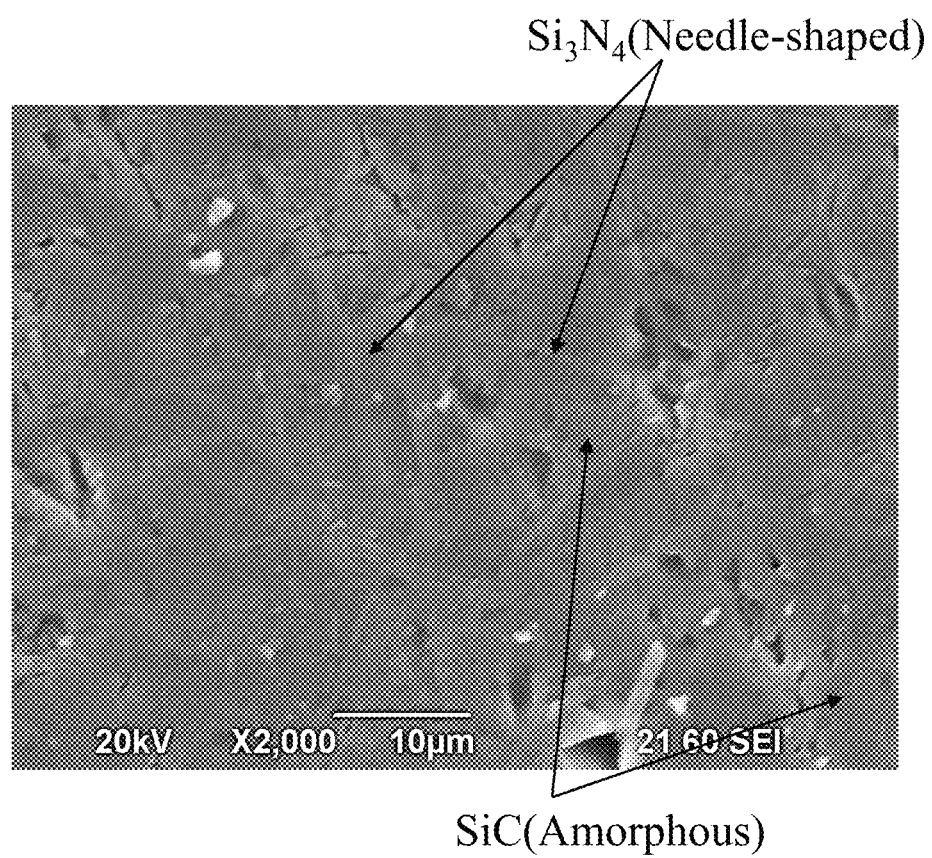
FIG. 3 is a surface microstructure image of a SiC—Si$_3$N$_4$ composite material manufactured according to an embodiment of the present invention.

FIG. 2 is a surface microstructure image of a conventional SiC wafer, and FIG. 3 is a surface microstructure image of a $SiC$—$Si_3N_4$ composite material manufactured according to an embodiment of the present invention. According to FIG. 2, it can be confirmed that only an amorphous thin flaky cross-sectional structure appears in the case of a wafer using only conventional SiC, and it can be clearly confirmed that the amorphous SiC crystal grains and the $Si_3N_4$ crystal grains having a needle-shaped structure are mixed in FIG. 3 in the case of a $SiC$—$Si_3N_4$ composite material manufactured according to an embodiment of the present invention.

According to an embodiment of the present invention, when the $Si_3N_4$ in the $SiC$—$Si_3N_4$ composite material has a volume ratio of 68 to 70% by volume, the $Si_3N_4$/SiC main peak may have a diffraction intensity ratio of 0.2 to 1.5.

FIG. 4 is a graph showing changes in the $Si_3N_4$ content ratio according to the N source/C source ratio of the $SiC$—$Si_3N_4$ composite material manufactured according to an embodiment of the present invention. According to FIG. 4, when the N source/C source ratio is 0.4 to 2, the $Si_3N_4$ content ratio becomes about 10 to 70% so that a certain content ratio may be included in the $SiC$—$Si_3N_4$ composite material, and excellent thermal shock strength may be secured.

FIG. 5, as a graph showing intensity values according to 2-theta when the $Si_3N_4$ content ratio according to the N source/C source ratio=2 of the $SiC$—$Si_3N_4$ composite material manufactured according to an embodiment of the present invention is 69%, refers to $\beta$-SiC and $\alpha$-$Si_3N_4$ crystal structures, and the diffraction intensity ratio of the main peak of each crystal phase may change depending on the $Si_3N_4$ content ratio. According to FIG. 5, when the $Si_3N_4$ content ratio is 69%, the $Si_3N_4$ main peak diffraction intensity/SiC main peak diffraction intensity ratio may be 1.5.

According to an embodiment of the present invention, the $SiC$—$Si_3N_4$ composite material may be impermeable.

According to an aspect, the $SiC$—$Si_3N_4$ composite material may exhibit impermeability and have high purity and high thermal shock strength by improving permeability of the existing SiC.

According to an embodiment of the present invention, the $SiC$—$Si_3N_4$ composite material may be manufactured according to the manufacturing method according to the aforementioned embodiment.

Hereinafter, the present invention will be described in more detail by Exemplary Embodiment and Comparative Embodiment.

However, the following Exemplary Embodiment is only for illustrating the present invention, and the content of the present invention is not limited to the following Exemplary Embodiment.

Exemplary Embodiment. Manufacturing of
$SiC$—$Si_3N_4$ Composite Material

A $SiC$—$Si_3N_4$ composite material was manufactured by injecting Si, N, and C sources at 1100 to 1600° C., which was a temperature at which $Si_3N_4$ and SiC were formed by the CVD method.

In this case, the N source/C source ratio relates to a ratio of N source to C source, and it was 0.4 to 2 when the nitrogen (N) component and the carbon (C) component of the nitrogen (N) and carbon (C) source gases were 1:1, and $Si_3N_4$ in the total material was had a volume ratio of 13 to 70%.

As a result of measuring thermal shock strength of such a composite material $SiC$—$Si_3N_4$ composite material with a thermal shock strength measuring device, the thermal shock strength was measured as A=600 to 860° C.

*87 FIG. 1 is a cross-sectional view of a conventional SiC wafer, and FIG. 2 is a surface microstructure image of a conventional SiC wafer.

FIG. 3 is a surface microstructure image of a $SiC$—$Si_3N_4$ composite material manufactured according to an embodiment, and when comparing with FIG. 2, it can be confirmed that needle-shaped and amorphous crystal grains are mixed. Through this, when comparing with the conventional SiC wafer having an amorphous structure according to FIG. 2, it can be definitely confirmed that $Si_3N_4$ having a needle-shaped structure is included.

FIG. 4 is a graph showing changes in the $Si_3N_4$ content ratio according to the N source/C source ratio of the $SiC$—$Si_3N_4$ composite material manufactured according to an embodiment of the present invention. According to FIG. 4, when the N source/C source ratio is 0.4 to 2, it is confirmed that the $Si_3N_4$ content ratio becomes about 10 to 70% so that a certain content ratio may be included in the $SiC$—$Si_3N_4$ composite material, and excellent thermal shock strength may be secured.

FIG. 5, as a graph showing intensity values according to 2-theta when the $Si_3N_4$ content ratio according to the N source/C source ratio=2 of the $SiC$—$Si_3N_4$ composite material manufactured according to an embodiment of the present invention is 69%, refers to β-SiC and α-$Si_3N_4$ crystal structures, and the diffraction intensity ratio of the main peak of each crystal phase may change depending on the $Si_3N_4$ content ratio. According to FIG. 5, when the $Si_3N_4$ content ratio is 69%, the $Si_3N_4$ main peak diffraction intensity/SiC main peak diffraction intensity ratio may be 1.5.

FIG. 6 is a graph showing changes in the thermal shock strength according to the $Si_3N_4$ content of the $SiC$—$Si_3N_4$ composite material manufactured according to an embodiment, and it can be confirmed that the thermal shock strength is 600° C. or higher at a time point when the $Si_3N_4$ content exceeds 40%, and the thermal shock strength is rapidly increased to lower than 700° C. until the $Si_3N_4$ content becomes less than 80%.

Although the embodiments have been described with reference to the limited Exemplary Embodiments and drawings as described above, various modifications and variations are possible from the above description by one of ordinary skill in the art. For example, appropriate results can be achieved although described techniques are performed in order different from a described method, and/or described elements are joined or combined in a form different from the described method, or replaced or substituted by other elements or equivalents. Therefore, other implementations, other embodiments, and equivalents to the scope of claims also belong to the scope of the claims described later.

The invention claimed is:

1. A $SiC$—$Si_3N_4$ composite material consisting of a mixture of β-SiC and $Si_3N_4$ needle-shaped crystal grains with a thermal shock strength of 600 to 860° C., wherein the $Si_3N_4$ in the $SiC$—$Si_3N_4$ composite material is 10 to 70% by volume.

2. The $SiC$—$Si_3N_4$ composite material of claim 1, wherein when the $Si_3N_4$ in the $SiC$—$Si_3N_4$ composite material has a volume ratio of 68 to 70% by volume, the $Si_3N_4$/SiC main peak has a diffraction intensity ratio of 0.2 to 1.5.

* * * * *